United States Patent [19]
Basol et al.

[11] Patent Number: 4,629,820
[45] Date of Patent: Dec. 16, 1986

[54] THIN FILM HETEROJUNCTION PHOTOVOLTAIC DEVICES

[75] Inventors: Bulent M. Basol, Los Angeles; Eric S. Tseng, Torrance; Dennis S. Lo, South Gate, all of Calif.

[73] Assignees: Standard Oil Commercial Development Company, Cleveland, Ohio; BP Solar International Ltd., London, England

[21] Appl. No.: 762,474

[22] Filed: Sep. 17, 1985

Related U.S. Application Data

[62] Division of Ser. No. 576,559, Feb. 3, 1984, Pat. No. 4,548,681.

[51] Int. Cl.$^4$ .............................................. H01L 31/06
[52] U.S. Cl. ..................................... 136/255; 136/258; 136/260; 136/264; 357/15; 357/16; 357/30
[58] Field of Search ......... 136/255, 260, 264, 258 PC; 357/15, 16, 30

[56] References Cited

U.S. PATENT DOCUMENTS

| | | | |
|---|---|---|---|
| 3,496,024 | 2/1970 | Ruehrwein | 136/254 |
| 4,243,885 | 1/1981 | Agouridis et al. | 250/370 |
| 4,388,483 | 6/1983 | Basol et al. | 136/260 |
| 4,400,244 | 8/1983 | Kroger et al. | 204/2.1 |
| 4,465,565 | 8/1984 | Zanio | 204/56 R |

OTHER PUBLICATIONS

G. Cohen-Solal et al, "Advances in Graded Gap Solar Cell Research", *Conference Record, 9th IEEE Photovoltaic Specialists Conf.*, (1972), pp. 28–36.

*Primary Examiner*—Aaron Weisstuch
*Attorney, Agent, or Firm*—Jeffrey A. Wyand; Joseph G. Curatolo; Larry W. Evans

[57] ABSTRACT

Thin films of $Hg_{1-x}Cd_xTe$ with controlled x greater than 0.5 are cathodically deposited on a thin CdS film over a conductive film of ITO deposited on a glass substrate. Depositing a conductive film on the electrodeposited $Hg_{1-x}Cd_xTe$ treated to provide a Te-rich surface for a good ohmic contact forms an improved solar cell.

5 Claims, 6 Drawing Figures

THIN FILM HETEROJUNCTION PHOTOVOLTAIC DEVICES

This is a division of application Ser. No. 576,559 filed Feb. 3, 1984, now U.S. Pat. No. 4,548,681.

BACKGROUND OF THE INVENTION

This invention relates to thin film photovoltaic devices that utilize Cd rich $Hg_{1-x}Cd_xTe$ as a variable bandgap material, and to the cathodic electrodeposition of $Hg_{1-x}Cd_xTe$ thin films with controlled stoichiometry $(1-x)$ and thus with controlled electronic and optical properties.

General electrodeposition procedures for CdTe have been given in U.S. Pat. No. 4,400,244 granted to F. A. Kroger, R. L. Rod and M. P. R. Panicker, and assigned to Monosolar, Inc. Briefly, to form a cadmium telluride coating on a conductive cathode, the electrolyte consists of $HTeO_2^+$ as the source of tellurium and $Cd^{2+}$ as the source of cadmium. Discharged $HTeO_2^+$ ions at the cathode reacts with $Cd^{2+}$ and form CdTe deposit on the cathode.

More specific conditions for CdTe electrodeposition and details of a process utilized to make thin film heterojunction solar cells using these films have been described in U.S. Pat. No. 4,388,483 granted to B. M. Basol, E. S. Tseng and R. L. Rod and assigned to Monosolar, Inc. Briefly in this patent, a sheet of an insulating transparent material, such as glass, is prepared with, on one side, a transparent conductive film, such as a tin oxide or indium tin oxide (ITO) layer, using conventional deposition techniques. Then a layer of a semiconductor, such as cadmium sulfide is electrodeposited. The combination of the conductive oxide and the cadmium sulfide comprise an n-type wide bandgap semiconductor different from the next layer deposited, which is cadmium telluride. This structure is then heat treated at a temperature between 250° and 500° C. for a time sufficient to convert the CdTe film to a substantially low resistivity p-type semiconductor compound. A conductive film, such as gold is then deposited on the cadmium telluride to complete the photovoltaic cell which receives radiation through the glass substrate and the n-type semiconductor acting as a wide bandgap window.

Heat treating the cadmium telluride was found to increase the power output of the photovoltaic cell by a factor of 60. It is believed that, in the absence of heat treatment, the electrodeposited cadmium telluride is a high resistivity n-type material and the cadmium sulfide serves as an electron injecting contact to one surface of the CdTe film rather than a rectifying contact. When the top conductor (e.g., gold) is deposited over the surface of the CdTe film, an n-CdTe/Au Schottky barrier is obtained. This is intrinsically a low efficiency structure. When heat treated (before depositing the Au), substantially all of the CdTe is converted to p type, due apparently to the generation of electrically active Cd vacancies. This shifts the barrier from the n-CdTe/Au interface to the CdS/p-CdTe interface and gives a high efficiency heterojunction structure.

$Hg_{1-x}Cd_xTe$ is a very important infrared detector material. Its bandgap is a function of its stoichiometry and can be changed from 0 to 1.5 eV going from $x=0.17$ to $x=1.0$. So far the interest in this material has been limited to the infrared applications. Early work on $Hg_{0.795}Cd_{0.205}Te$ detectors (sensitive at $\lambda=8-12$ μm) was later followed by investigation of structures that are suitable for use in the 1-3, 3-5, and 15-30 μm range. All these applications require a Hg rich material $(x<0.5)$. A survey of previous literature shows no successful attempt of utilizing Cd rich $(x>0.5)$ mercury cadmium telluride for solar cell applications.

$Hg_{1-x}Cd_xTe$ crystals can be prepared by techniques well known in the art (such as Bridgman growth, zone melting, and Czochralski). Epitaxial growth can be achieved by (liquid phase epitaxy LPE) and (vapor phase epitaxy VPE). There has not been much work on polycrystalline thin films of $Hg_{1-x}Cd_xTe$.

From this review of the prior art, it is apparent that there has been a failure to appreciate the potential of cadmium rich polycrystalline $Hg_{1-x}Cd_xTe$ for solar cell applications. This may partly be due to the difficulties associated with the preparation of such films in an inexpensive way and with controlled stoichiometry.

Again the review of the prior art shows the lack of an inexpensive method for the production of $Hg_{1-x}Cd_xTe$ films. The property of bandgap control for $Hg_{1-x}Cd_xTe$ is extremely important for high efficiency stacked cells where two or more cells respond to different parts of the solar spectra. In the area of thin-film amorphous cells, there has been extensive research on variable bandgap alloys (such as amorphous Si-Ge alloys) that would be compatible with the top amorphous Si cell. But until this invention there has not been any success in finding a variable bandgap polycrystalline thin film that can be controllably and inexpensively produced and utilized.

OBJECTS AND SUMMARY OF THE INVENTION

An object of the present invention is to demonstrate the utilization of Cd rich $Hg_{1-x}Cd_xTe$ thin films in solar cells. As a result of this invention, cells sensitive to different portions of the solar spectra can be constructed and thus make possible the production of stacked cells (tandem cells) with high efficiencies as well as the single junction cells with uniform or graded bandgaps.

Another object is to provide an inexpensive electrodeposition technique that is capable of yielding $Hg_{1-x}Cd_xTe$ films with controlled electronic and optical properties.

Yet another object of the present invention is to form heterojunction thin film photovoltaic cells with electrodeposited $Hg_{1-x}Cd_xTe$ layers.

Still another object of this invention is to teach a specific composition of the electroplating bath that yields high efficiency $Hg_{1-x}Cd_xTe$ and CdTe solar cells.

In accordance with the present invention, thin films of polycrystalline $Hg_{1-x}Cd_xTe$, with controlled Hg content are cathodically electrodeposited on conductive substrates from an aqueous solution containing 0.2M to 1.5M of $Cd^{2+}$ ions, $10^{-5}M$ to $10^{-3}M$ of $HTeO_2^+$ ions and $Hg^{2+}$ ions. The concentration of the $Hg^{2+}$ ions is adjusted to 1 to 20 ppm depending upon the desired stoichiometry of the deposit. The pH of the electrolyte is adjusted to a level between 1 and 3. The applied potential is adjusted so that the potential of the surface of the deposit with respect to a Ag-AgCl reference electrode under open circuit condition (i.e., QRP, Quasi Rest Potential) is between $-300$ mV and $-600$ mV. The temperature of the electrolyte is kept around 85° to 90° C. Although the primary interest of the present electrodeposition process is cations ($Cd^{2+}$ and $HTeO_2^+$), the nature of the anions also affects the film properties. The addition of Cl-ions in the bath, for example, improves the short circuit current of photovoltaic cells, as will be described in Example 3.

Thin film solar cells are produced by depositing layers of $Hg_{1-x}Cd_xTe$ on the CdS film of a glass-/ITO/CdS substrate. The CdS film is electrodeposited on the ITO coated glass using an electrolyte that consists of 0.1M to 0.5M cadmium sulfate or cadmium chloride and about 0.01M to 0.05M of sodium thiosulfate with a pH of about 4 at the beginning of the plating. The deposition voltage is kept between −0.6 and −0.7 volts with respect to a calomel reference electrode, and the bath temperature about 90° C.

Device processing includes an annealing step (8–10 minutes at about 400° C.) which forms the rectifying junction at the $CdS/Hg_{1-x}Cd_xTe$ interface. After etching the surface of the $Hg_{1-x}Cd_xTe$ film, the etched surface is treated with a strong basic solution. Devices are completed by depositing metal ohmic contacts on the etched and treated surface. Cells responsive to various wavelengths are produced by changing the stoichiometry of the $Hg_{1-x}Cd_xTe$ films, i.e., by changing (1−x).

Various examples will now be given to show (1) how $Hg_{1-x}Cd_xTe$ films can be electrodeposited, (2) how thin film solar cells can be manufactured using these films and (3) how their performance can be improved.

DESCRIPTION OF PREFERRED EMBODIMENTS

Figure 1:
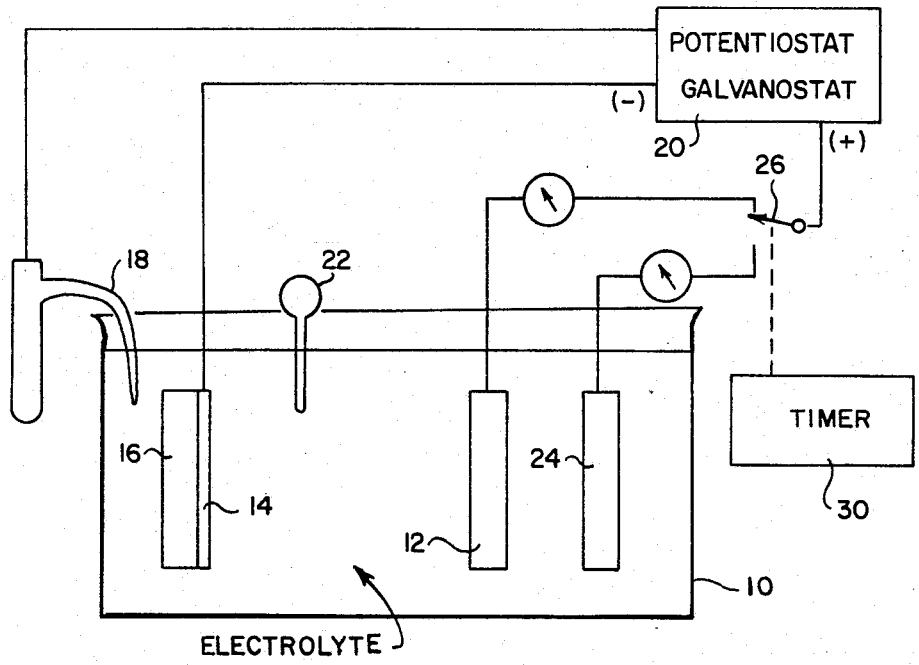
FIG. 1 is a schematic diagram of the chemical electrodeposition set-up for the present invention.

Referring now to FIG. 1 of the drawings, a chemical electrodeposition set-up useful for the present invention is shown schematically. It is essentially the same as for any electrodeposition process in that it utilizes a vessel 10 to hold the electrolyte, which for electrodepositing $Hg_{1-x}Cd_xTe$ is an aqueous solution containing $Cd^{2+}$, $HTeO_2^+$ and $Hg^{2+}$ ions. The principal anode is a Te anode 12, and the cathode is a conductive film 14 on a glass substrate 16. A reference electrode 18 is connected to a potentiostat/galvanostat 20. A thermometer 22 is used to monitor the bath temperature. To that general set-up, there is added an inert graphite anode 24 and a switch 26 for alternately connecting the anodes to the potentiostat/galvanostat 20 through which the power is applied in a controlled manner. The switch is shown as a manual switch, but in practice the switch is electronic and is controlled by a timing circuit 30.

EXAMPLE 1

(Electrodeposition of $Hg_{1-x}Cd_xTe$)

An electrolytic bath was prepared in accordance with the following procedures: ACS grade $CdSO_4$ was dissolved into double distilled water in a 3 liter beaker. The volume of the electrolyte was 1.6 liter and $Cd^{2+}$ concentration was 0.5M. The pH was 4.3. The beaker was placed on a hot plate and the solution was heated up to 90° C. while stirring it at the same time with a magnetic stirrer. Then the electrolyte was purified for two hours using the inert graphite anode 24 and a platinum gauze cathode. The cathode potential was kept at −620 mV with respect to a Ag-AgCl reference electrode 18 during this dummy plating which lowered the impurity concentration in the bath to acceptable levels. After purification, 0.015M of $Cl^-$ was added into the solution using HCl. This is a crucial step for getting high efficiency devices. A separate example set forth hereinafter will demonstrate this fact.

After adding $Cl^-$, the pH was adjusted to 1.6 (at room temperature) by adding concentrated $H_2SO_4$ into the solution. This was followed by the introduction of $HTeO_2^+$ into the electrolyte. $HTeO_{2+}$ was introduced by using the pure Te anode 12 and a Pt gauze cathode. The potential of the Te anode was kept at +500 mV with respect to the Ag-AgCl reference electrode 18 until the tellurium concentration (as monitored by an atomic absorption spectrophotometer not shown in FIG. 1) of 38 ppm was reached. After plating nine CdTe films on glass/ITO/CdS substrates, 3.5 ppm of $Hg^{2+}$ was added into the electrolyte from a 1000 ppm of $HgCl_2$ stock solution. $Hg_{1-x}Cd_xTe$ film was deposited on 5×6 cm area of a glass/ITO/CdS substrate using both anodes 12 and 24 (a Te rod and a graphite rod, respectively). The tellurium concentration in the solution was kept around $3\times10^{-4}$M by controlling the switching time of the timer 30 which alternately switches between the two anodes. In the present example, the tellurium anode 12 was in the circuit for one minute and the graphite anode 24 was in for 15 seconds alternately throughout the deposition. The QRP (Quasi Rest Potential) was kept around −600 mV to −700 mV except during the first few minutes when it was lower. Table I shows the plating parameters throughout deposition.

TABLE 1

| Plating Time | $-V_{applied}$ (mV) | I (mA) | −QRP (mV) |
|---|---|---|---|
| 30 sec | 865 | 10 | 350 |
| 1 min | 890 | 9.6 | 540 |
| 2 min | 895 | 9.9 | 680 |
| 3 min | 895 | 9.7 | 690 |
| 5 min | 888 | 9.6 | 680 |
| 14 min | 885 | 9.6 | 675 |
| 35 min | 885 | 10.2 | 675 |
| 52 min | 885 | 9.9 | 655 |
| 1 hr 10 min | 885 | 10.3 | 655 |
| 2 hrs | 885 | 11.0 | 625 |

The resulting film (No. 1) was dissolved in $HNO_3$ and its chemical composition was measured by atomic absorption spectrophotometer. It was found to contain Cd, Te and Hg but the question of whether the deposit was in the form of a compound ($Hg_{1-x}Cd_xTe$) or a mixture could be answered only by optical measurements. When the optical bandgap of the film was measured, it was found to be smaller than that of CdTe thereby proving the existence of the $Hg_{1-x}Cd_xTe$ compound.

EXAMPLE 2

(Stoichiometry Control of $Hg_{1-x}Cd_xTe$)

Figure 2:
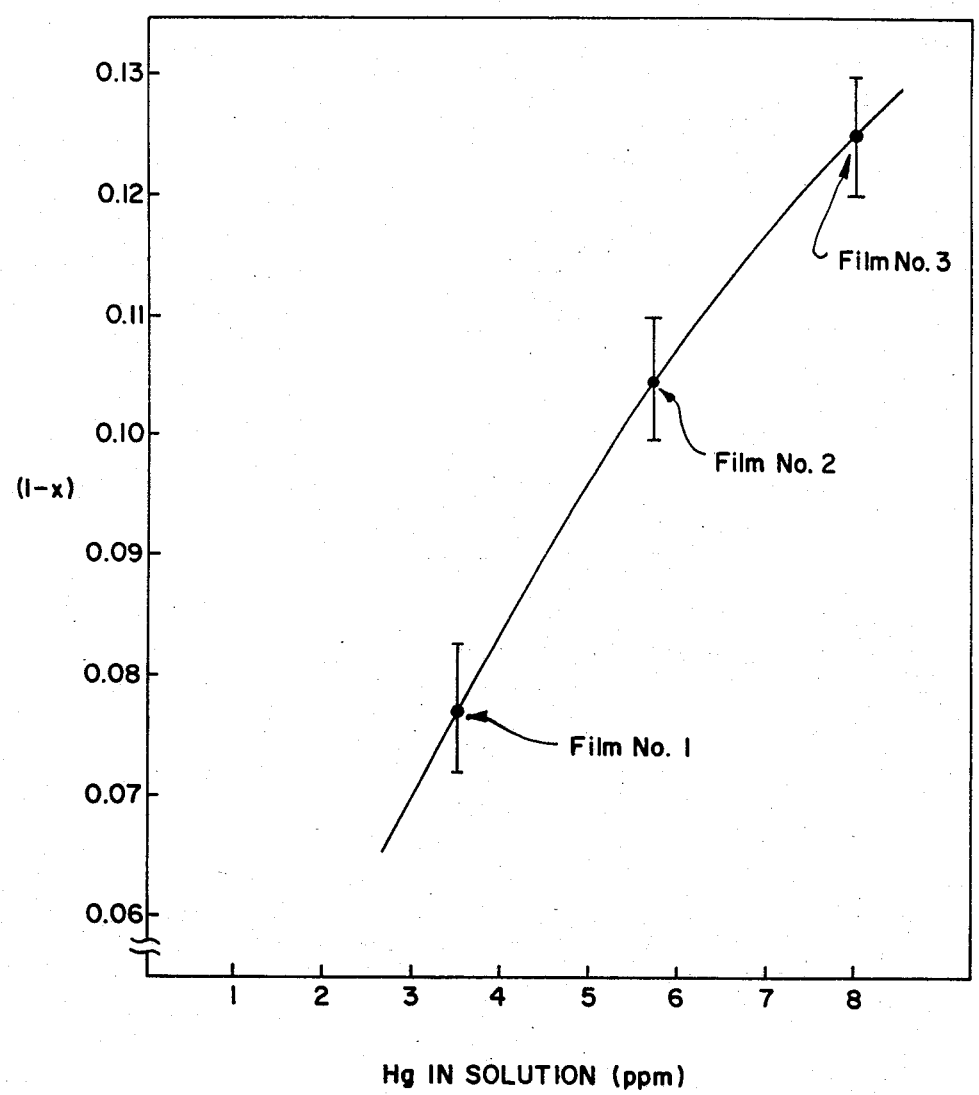
FIG. 2 is a graph of the $Hg^{2+}$ concentration in the solution with respect to the measured stoichiometry (1−x) of electrodeposited $Hg_{1-x}Cd_xTe$ films, demonstrating the stoichiometry control possible with the present invention.

To demonstrate the stoichiometry control made possible by the present technique, two more films (films No. 2 and No. 3) were deposited using the solution prepared for Example 1 and adding more Hg into this solution. The $Hg^{2+}$ concentration in the solution with respect to the measured stoichiometry $(1-x)$ of the resulting $Hg_{1-x}Cd_xTe$ films is indicated in FIG. 2. Tables 2 and 3 show the plating parameters for films No. 2 and No. 3 respectively. Again, it should be noted that the QRP is low at the beginning of the plating and then it goes up, stabilizing at a level more positive than −700 mV.

TABLE 2

| Plating Time | $-V_{applied}$ (mV) | I (mA) | QRP (mV) |
|---|---|---|---|
| 30 sec | 860 | 9.9 | 350 |
| 1.5 min | 885 | 10.0 | 350 |
| 2.5 min | 900 | 9.8 | 400 |
| 3 min | 910 | 10.1 | 655 |
| 6 min | 907 | 10.5 | 785 |
| 7 min | 890 | 9.6 | 740 |
| 8 min | 875 | 9.3 | 680 |
| 10 min | 875 | 9.2 | 625 |
| 12 min | 880 | 9.3 | 600 |
| 15 min | 885 | 9.2 | 650 |
| 22 min | 885 | 9.6 | 650 |
| 45 min | 885 | 9.8 | 645 |
| 1 hr | 885 | 9.5 | 635 |
| 1¼ hr | 885 | 9.3 | 655 |
| 1¾ hr | 885 | 9.5 | 625 |
| 2 hrs | 885 | 9.5 | 615 |

TABLE 3

| Plating Time | $-V_{applied}$ (mV) | I (mA) | QRP (mV) |
|---|---|---|---|
| 30 sec | 860 | 9.1 | 350 |
| 1 min | 880 | 9.7 | 400 |
| 1.5 min | 905 | 9.8 | 755 |
| 2.5 min | 885 | 9.4 | 685 |
| 4.5 min | 885 | 8.9 | 600 |
| 7 min | 890 | 8.7 | 660 |
| 10 min | 890 | 9.1 | 700 |
| 20 min | 885 | 9.2 | 670 |
| 35 min | 885 | 9.3 | 680 |
| 1 hr | 885 | 9.4 | 680 |
| 1 1/6 hr | 885 | 9.4 | 680 |
| 1 hr 58 min | 885 | 9.7 | 650 |
| 2 hrs | 885 | 9.8 | 680 |

FIG. 2 shows that a controlled change in stoichiometry is possible by control of the mercury content in the solution. The effect of this change in stoichiometry on the electrical and optical properties of the film was studied by optical measurements and also by making solar cells using these films. The following section describes the production of such devices. The energy gap ($E_g$) vs the Hg content in the films was derived from the transmission/reflection data of optical measurements and plotted in FIG. 3. It is observed that the bandgap values follow the theoretically expected linear dependence on $(1-x)$. This demonstrates the stoichiometry control of bandgap for photovoltaic devices made possible with the simple, low-cost deposition technique of the present invention.

PRODUCTION OF DEVICES FROM FILMS OF EXAMPLES 1 and 2

Figure 4:
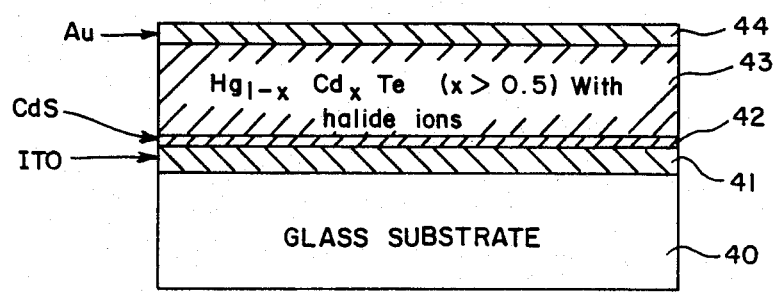
FIG. 4 is a cross sectional view of a photovoltaic cell constructed in accordance with the present invention.

The films of Examples 1 and 2 were further processed to make thin film photovoltaic cells for the purpose of demonstrating the possibility of producing bandgap tailored, low-cost, thin-film devices. The device illustrated schematically in FIG. 4 is comprised of a sheet 40 of insulating transparent material (glass) having a layer 41 of conductive transparent material (ITO) on which a film 42 of a semiconductor (CdS) was electrodeposited before electrodepositing film 43 of $Hg_{1-x}Cd_xTe$. A thin film 44 of conductive material (Au or Ni) was then evaporated on the film 43 for use as the back contact. A front contact was made to the conductive film 41 by first etching away the semiconductor layers 42 and 43, thus exposing the conductive film 41 in an area to one side of the device.

If the $Hg_{1-x}Cd_xTe$ films of Examples 1 and 2 were not heat treated before the deposition of the thin film 44 Schottky barrier solar cells responding to different wavelengths were obtained.

The heterojunctions were produced if the films of Examples 1 and 2 were first heat treated in accordance with the aforesaid U.S. Pat. No. 4,388,483. Heat treatment was carried out at 400° C. in air for 8 minutes. This step is believed to generate Cd and Hg vacancies in the films which act as acceptors and give rise to a suitably low resistivity p-type material. After the heat treatment films were cooled down to room temperature, the following etching and relating procedures were performed:

a. The surface of the $Hg_{1-x}Cd_xTe$ film 43 was first etched in a 0.1% bromine in methanol solution. This etch removes a very thin layer of material (<100 Å) and leaves a clear working surface. This is not a crucial step in the process, it can be left out if the film 43 is freshly made.

b. Then the surface was etched in a dichromate solution ("Dichrol" by American Scientific Products) for one second and rinsed under D.I. water. This etch leaves a Te-rich surface which is necessary for a good ohmic contact.

c. After the dichromate etch, the sample was immersed into a beaker filled with hydrazine (monohydrate by Fisher Scientific Company) for ten minutes at room temperature. As described in U.S. Pat. No. 4,456,630, this step, along with step b, is important in device processing. It treats the surface of the film in a way to eliminate any high resistance or barrier associated with the ohmic contact.

d. Following the surface preparation steps described above, a metal film 44, such as Au or Ni, was evaporated onto the surface treated semiconductor film. This metal film constituted the back contact to the finished cell.

e. A front contact was then made by removing the films 44 43, and 42, as noted above, to expose the conductive film 41 of ITO.

The devices were then checked for their spectral responses and $V_{oc}$, $I_{Sc}$ values.

Figure 3:
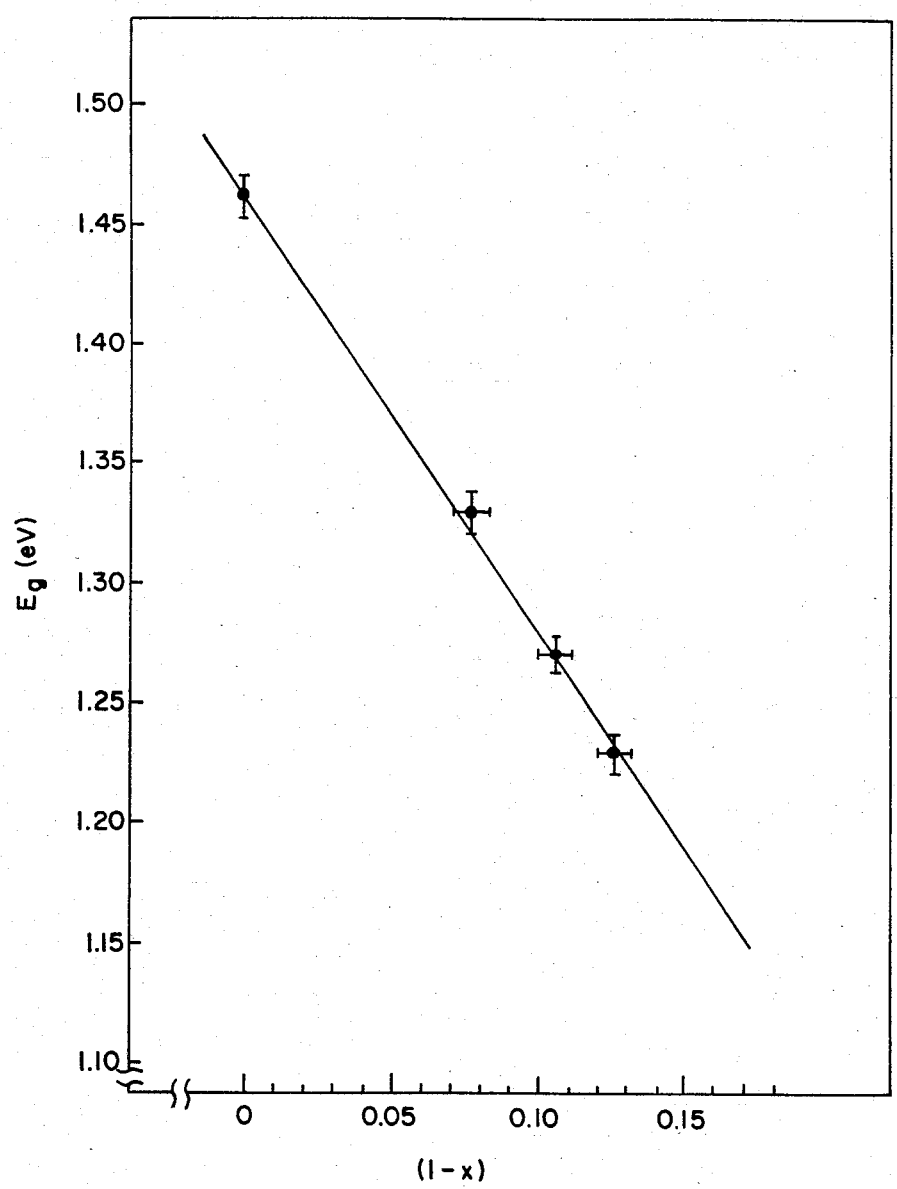
FIG. 3 is a graph of the energy gap ($E_g$) vs the Hg content in $Hg_{1-x}Cd_xTe$ films derived from the transmission/reflection data of optical measurements.
Figure 5:
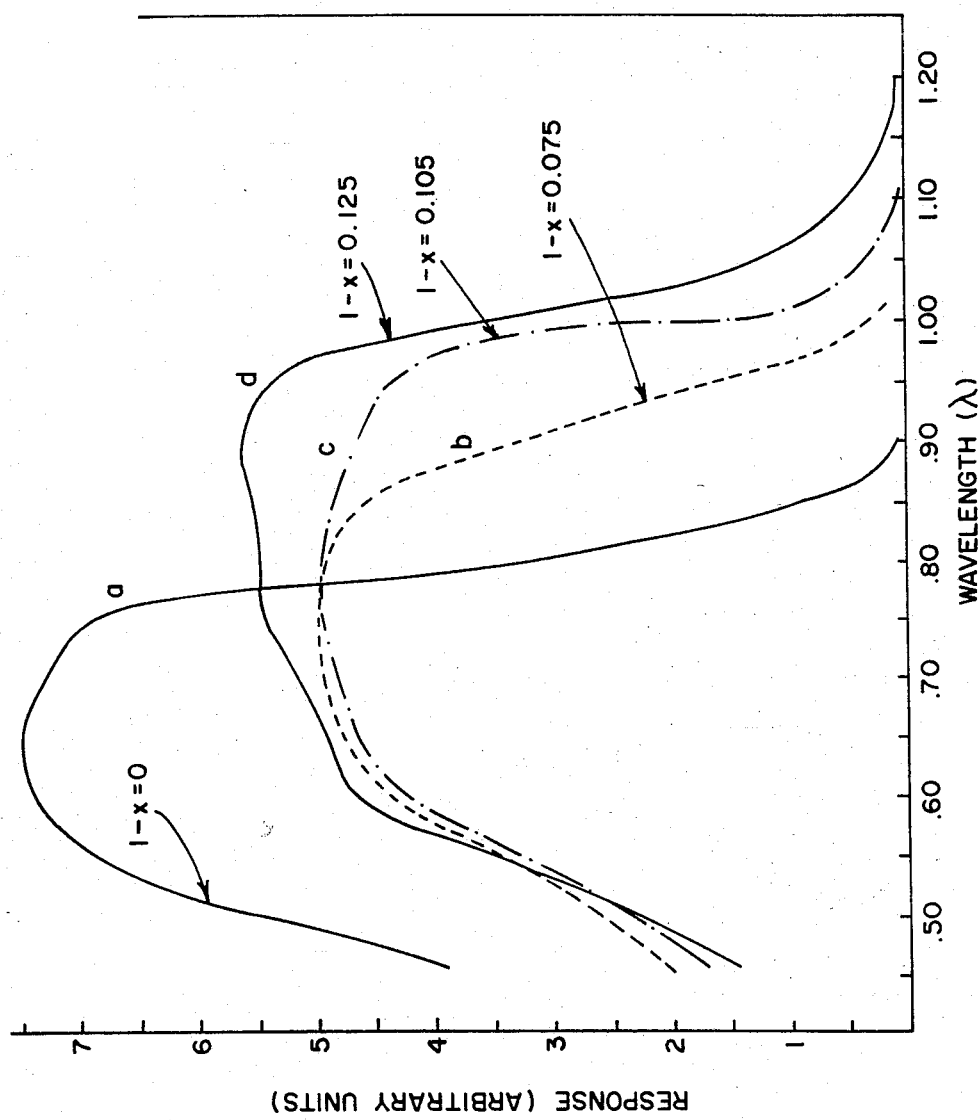
FIG. 5 shows graphs of spectral responses of thin film $Hg_{1-x}Cd_xTe$ solar cells which can be tailored by control of x in the electrodeposition process.
Figure 6:
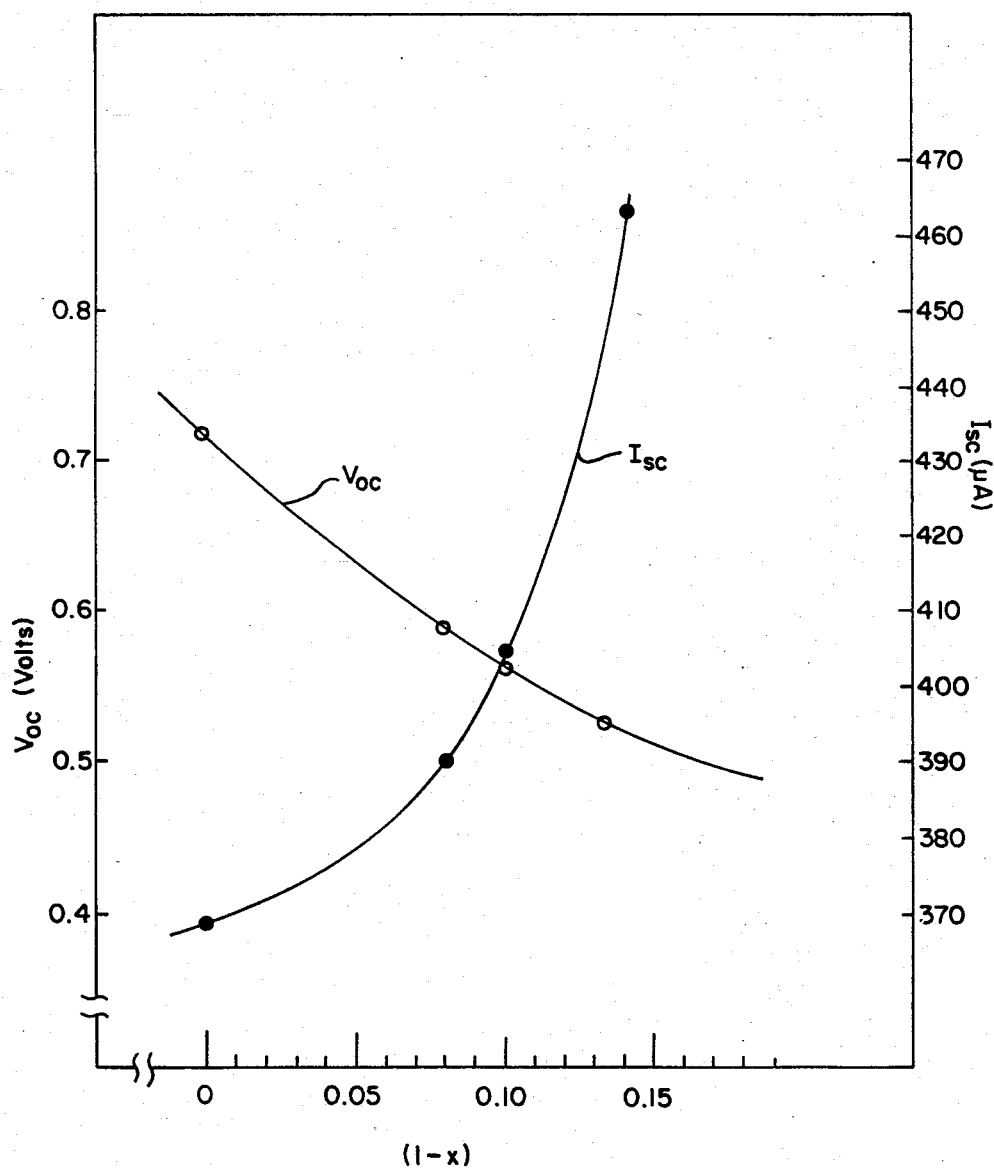
FIG. 6 is a graph of $V_{oc}$ and $I_{sc}$ as a function of (1−x) in thin film photovoltaic devices utilizing thin film $Hg_{1-x}Cd_xTe$.

FIG. 5 illustrates how the response of a thin film solar cell can be tailored utilizing the present invention. Curves a, b, c and d in FIG. 5 correspond to $(1-x)=0$, 0.075, 0.105 and 0.125, respectively. The extension of the cell response deeper into the infrared region with larger $(1-x)$ values is clear from this figure. FIG. 6 shows the $V_{oc}$ and $I_{sc}$ values of cells (0.02 cm² area)

made on films that were previously used in the badgap measurements (FIG. 3). As expected from the change in the bandgap, the open circuit voltage decreases and the short circuit current increases with increased Hg content in the films.

EXAMPLE 3

This example demonstrates the importance of $Cl^-$ addition into the electrolyte. The following experiment was carried out to study this phenomenon:

A CdTe plating bath was prepared in accordance with the following procedures:

a. 700 ml, 0.5M, ACS grade $CdSO_4$ solution was prepared using double distilled water. The solution was heated up to 90° C. and gently stirred.

b. The electrolyte was purified for 2 hours using a platinum gauze as a cathode, a graphite rod as the anode and a Ag-AgCl electrode as the reference. A PAR 173 potentiometer was used to apply a cathode potential of −620 mV during this process.

c. The pH of the solution was adjusted to 1.6 by adding concentrated $H_2SO_4$.

d. Te was introduced into the electrolyte by applying +500 mV to a pure Te block anode and using Pt gauze as the cathode electrode. The Te introduction was terminated when Te concentration reached 35 ppm.

After the preparation of this standard bath, the $Cl^-$ concentration in the solution was changed using concentrated HCl and the resulting films were used to make heterojunction solar cells following the procedures described in Example 3. Both the mechanical integrity of the films after the heat treatment step and the short circuit current densities of the devices were evaluated as a function of $Cl^-$ concentration. Table 4 shows the results for 0.02 cm² area devices.

TABLE 4

| Sample No. | $[SO_4^{-2}]$ | $[Cl^-]$ | $I_{sc}(\mu A)$ |
|---|---|---|---|
| F22-1 | 0.5 M | 0 | 225 |
| F22-2 | 0.5 M | 0 | 225 |
| F22-3 | 0.5 M | 0.0025 M | 290 |
| F22-4 | 0.5 M | 0.005 M | 330 |
| F22-5 | 0.5 M | 0.005 M | 330 |
| F22-6 | 0.5 M | 0.005 M | 350 |
| F22-7 | 0.5 M | 0.005 M | 365 |
| F22-8 | 0.5 M | 0.01 M | 380 |
| F22-9 | 0.5 M | 0.015 M | 380 |

Although cells made with $Cl^-$ concentrations of up to 0.03M in the solution were still satisfactory, one could observe that the CdTe film was getting detached from the glass substrate at certain portions after the 400° C. heat treatment. So the preferred molar ratios of $Cl^-$ ion to $SO_4^{-2}$ ion in the solution are 0.01 to 0.06. Ratios smaller than 0.01 are not very effective and ratios greater than 0.06 give rise to poor adhesion between the substrate and the CdTe film. It is not yet very clear how the presence of $Cl^-$ in the electrolyte affects the properties of the deposited films. It may be that $Cl^-$ has a compensating effect on the grain boundaries which reduce the recombination velocity at these sites or $Cl^-$ may actually affect the growth morphology giving rise to a structure (such as good columnar growth) that yields higher short circuit current values in devices. All the above arguments are applicable to $Hg_{1-x}Cd_xTe$ deposition as well as to CdTe deposition. Naturally others of the more common halogen ions, namely $Br^-$, $F^-$ and $I^-$, can be used instead of $Cl^-$.

From the foregoing, it is evident that a new and improved method of electrodepositing a film of $Hg_{1-x}Cd_xTe$ has been disclosed, that the film may be cadmium rich, and the film may be provided with improved short circuit current in a photovoltaic cell by the inclusion of halide ions. Consequently, it is also evident that the present invention provides a new and improved thin-film solar cell. In the examples given, reference has been made to potentials in the electrodeposition process with respect to standard Ag-AgCl and calomel reference electrodes. These could have been given with respect to a normal hydrogen electrode as the reference which is 0.22 V below the Ag-AgCl reference electrode and 0.24 V below the calomel reference electrode. Since NHE is a standard at 0 volts, the potentials in the claims that follow are with respect to the normal hydrogen electrode. One can then choose which reference electrode to use.

What is claimed is:

1. A solar cell comprising at least one layer of polycrystalline cadmium-rich $Hg_{1-x}Cd_xTe$ (x>0.5) containing halide atoms, as an active solar energy absorbing layer.

2. The solar cell of claim 1 wherein one surface of said at least one layer of cadmium-rich $Hg_{1-x}Cd_xTe$ is in ohmic contact with a conductive metal layer; and the opposing surface of said at least one layer of cadmium-rich $Hg_{1-x}Cd_xTe$ contacts a layer of semiconductor material and forms a heterojunction with it.

3. The solar cell of claim 1 wherein one surface of said at least one layer of cadmium-rich $Hg_{1-x}Cd_xTe$ forms a Schottky barrier with a conductive metal layer; and the opposing surface of said at least one layer of cadmium-rich $Hg_{1-x}Cd_xTe$ contacts a layer of a semiconductor material.

4. The solar cell of claim 1 comprising a glass substrate coated with a conductive oxide layer, a layer of CdS disposed on said conductive oxide, said cadmium-rich layer of $Hg_{1-x}Cd_xTe$ disposed on said CdS layer, and a conductive metal layer disposed on and in ohmic contact with said $Hg_{1-x}Cd_xTe$ layer.

5. The solar cell of claim 4 having a tellurium-rich surface of said cadmium rich $Hg_{1-x}Cd_xTe$ layer disposed adjacent the ohmic contact.

* * * * *